(12) United States Patent
Leibiger

(10) Patent No.: US 8,080,847 B2
(45) Date of Patent: Dec. 20, 2011

(54) LOW ON RESISTANCE CMOS "WAVE" TRANSISTOR FOR INTEGRATED CIRCUIT APPLICATIONS

(75) Inventor: Steven Leibiger, Falmouth, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 178 days.

(21) Appl. No.: 12/420,435

(22) Filed: Apr. 8, 2009

(65) Prior Publication Data

US 2009/0250765 A1    Oct. 8, 2009

Related U.S. Application Data

(60) Provisional application No. 61/043,217, filed on Apr. 8, 2008.

(51) Int. Cl.
*H01L 29/66* (2006.01)

(52) U.S. Cl. .................. 257/341; 257/401; 257/E29.264

(58) Field of Classification Search .................. 257/205, 257/208, 341, 401, E29.135, E29.136, E29.264, 257/E29.12

See application file for complete search history.

(56) References Cited

U.S. PATENT DOCUMENTS

| 4,462,041 A * | 7/1984 | Glenn ............................ 257/401 |
| 4,599,789 A * | 7/1986 | Gasner .......................... 438/224 |
| 5,488,236 A | 1/1996 | Baliga |
| 5,742,087 A | 4/1998 | Lidow |
| 6,060,406 A | 5/2000 | Alers et al. |
| 2006/0023505 A1* | 2/2006 | Iizuka ....................... 365/185.05 |

FOREIGN PATENT DOCUMENTS

JP    2004 349331 A    12/2004

OTHER PUBLICATIONS

Fujishima, Naoto et al. "A High-Density Low On-Resistance Trench Lateral Power MOSFET With a Trench Bottom Source Contact", IEEE Transactions on Electron Devices, vol. 49, No. 8, Aug. 2002, pp. 1462-1468.

* cited by examiner

*Primary Examiner* — Kenneth Parker
*Assistant Examiner* — Tucker Wright
(74) *Attorney, Agent, or Firm* — Hiscock & Barclay, LLP

(57) ABSTRACT

In one embodiment of the present invention an array of power transistors on a semiconductor chip has repeating patterns of two "wave" gates which have alternating longer and shorter horizontal sections which are offset mirror images of each other together with a third straight horizontal section. Alternating source and drain regions lie between adjacent gates. Contacts are located adjacent each side of sections of the "wave" gates which connect the ends of the horizontal sections of the "wave" gates.

24 Claims, 22 Drawing Sheets

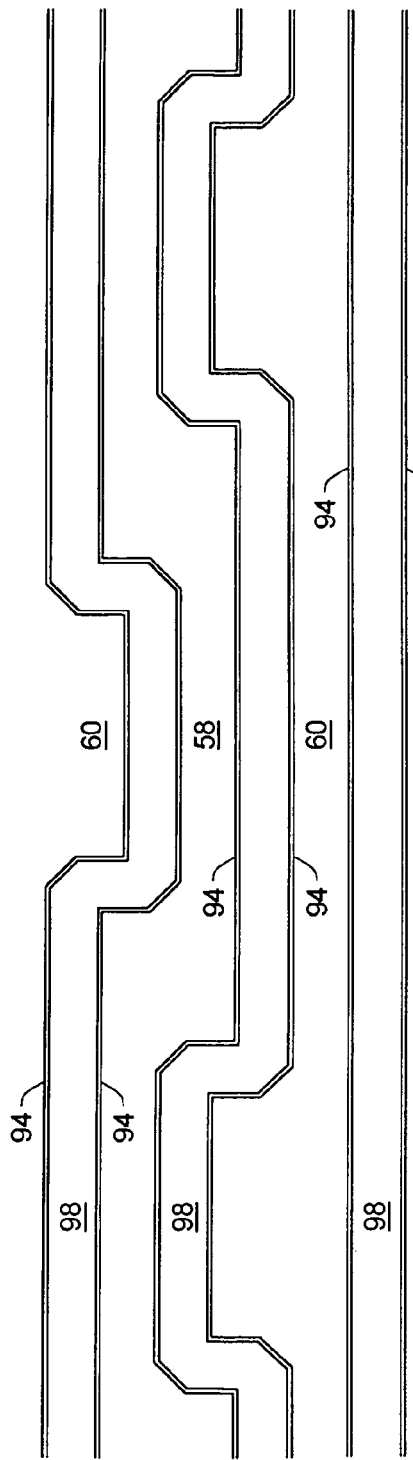
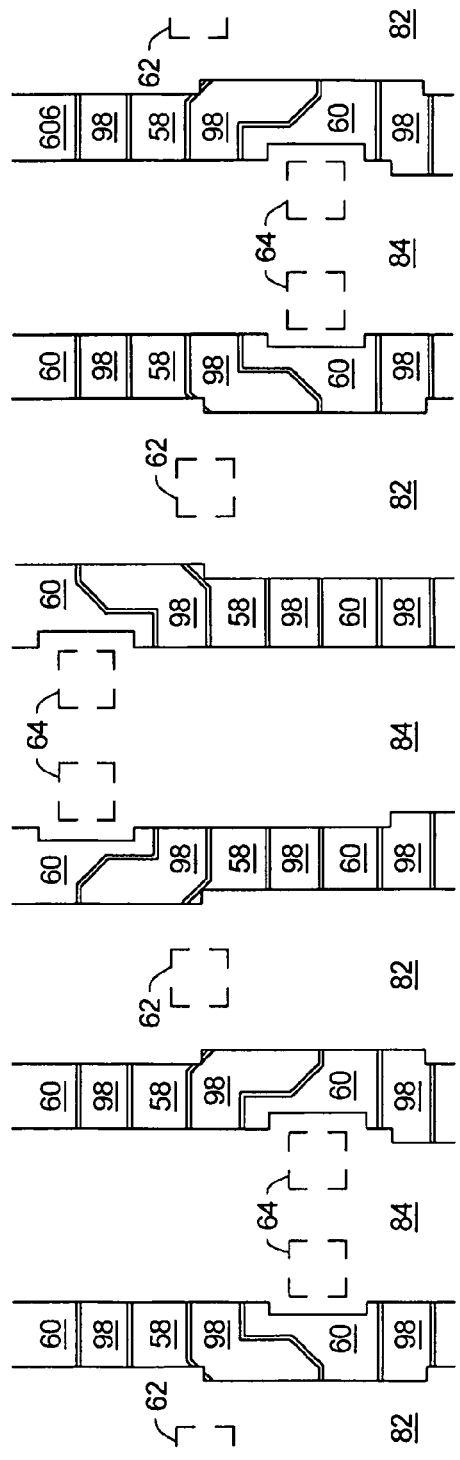
FIG. 11C
FIG. 11D

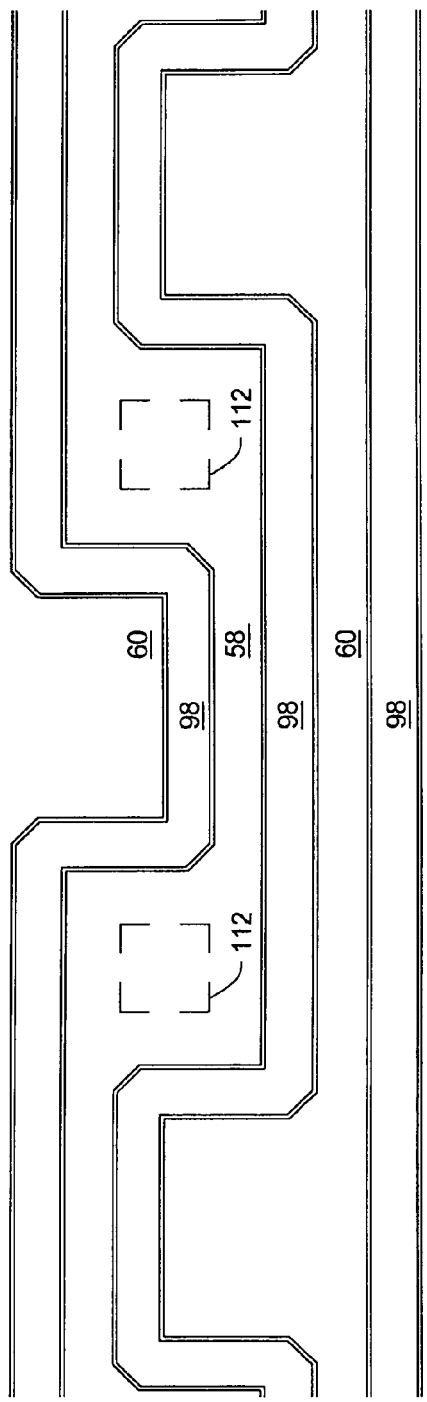
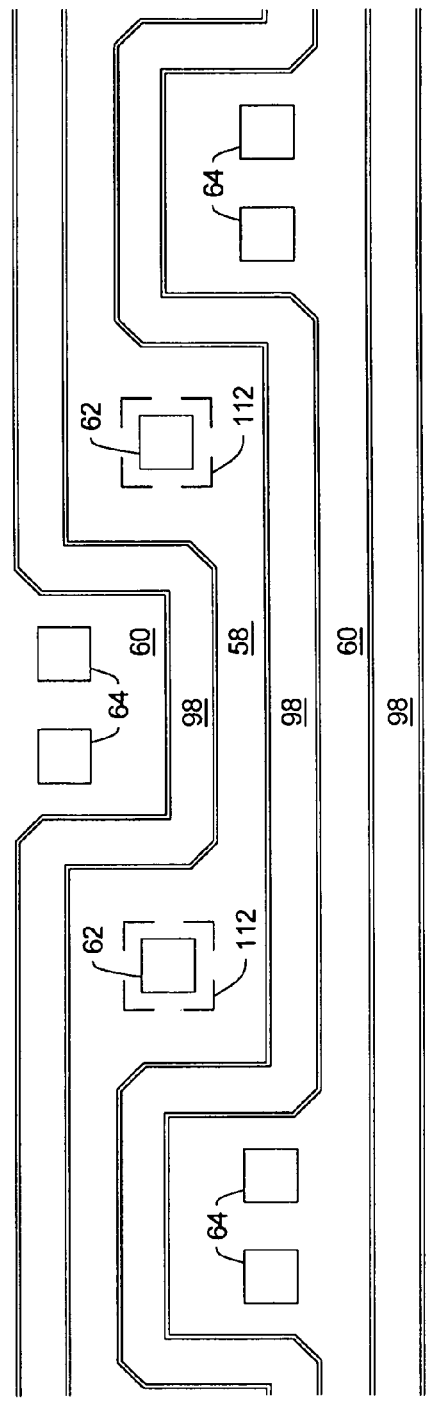
FIG. 12B
FIG. 12C

LOW ON RESISTANCE CMOS "WAVE" TRANSISTOR FOR INTEGRATED CIRCUIT APPLICATIONS

CROSS REFERENCE TO RELATED APPLICATIONS

This application claims the benefit of U.S. Provisional Application No. 61/043,217, filed Apr. 8, 2008, which is hereby incorporated by reference in its entirety. Reference is made to U. S. Patent Application No. 12/126,108, filed May 23, 2008.

FIELD OF THE INVENTION

This invention relates to low on resistance MOSFET transistors, and more particularly to low on resistance MOSFET transistors with longitudinal wave gates and with multiple contacts to the source and drain regions.

BACKGROUND OF THE INVENTION

MOSFETs with extremely large gate widths, such as power MOSFETs, naturally require more chip area than conventional MOSFETs, and therefore making compact power MOSFETs with large width gates is advantageous, especially when such MOSFETs are part of an integrated circuit, where layout area is a precious commodity. FIG. 1 is a top diagrammatic view of a current type of extended gate MOSFET 20 with large gate width, known as a waffle transistor. The gates 22 are laid out in a crosshatch lattice pattern with sources 24 and drains 26 formed inside the islands formed by the lattice of the gates. The individual sources 24 and drains 26 have silicide overlying regions 28 and are connected together by source contacts 30 to source metal 1 strips 32 and by drain contacts 34 to drain metal 1 strips 36. These metal 1 strips are connected together by metal 2 (not shown) which are also strips and run in a direction to intersect each of the metal 1 strips.

There are several characteristics of the waffle transistor 20 shown in FIG. 1 that limit the operating characteristics of the transistor. The poly sections 38 where the gates cross are about 10% of the total gate poly and do not contribute greatly to the device drive current because they lack access to the source and drain regions. Therefore, the layout area consumed by locations 38 is mostly wasted space. Furthermore, because of the stripped nature of the metallization about ½ of the deposited metal is removed because the minimum metal 1 line and space dimensions are about equal. Also since the metal strips are angled at an optimal 45° with respect to the direction of current flow (the metal 1 and metal 2 intersect each other), the length of the metal is increased by a factor of 1.4 which increases the effective $R_{on}$ of the transistor. Moreover, the vias between metal 1 and metal 2 can only be made at the intersection of the metal 1 and metal 2, and hence the amount of current which can pass between the two metal layers may be limited by the current capacity of the vias.

Power transistors usually require well taps to improve latchup and safe operating area (SOA) characteristics, which are connections between the sources and the wells with highly doped regions of the same polarity of impurities as the wells which extend from the wells to the source silicides, to provide increased immunity to latch-up of the transistor. However, in the waffle transistor 20 the gates 22 break the sources into small isolated regions, and there is not room to create a butted or integrated well tie in each source 24 of the waffle transistor 20. As a result each source location can be used as a true source or as a well tap. Replacing selected source locations with well ties 40, as shown in FIG. 2, results in a waffle transistor 42 which has lower drive and higher resistance, effectively making the transistor smaller. Moreover, there is a necessary gap between each source and a well tap, which diminishes the effectiveness of the well taps.

It is sometimes advantageous in power transistor arrays to put ballast resistors between the gate and the emitter to protect against electrostatic discharge (ESD) and to balance the current load for each part of or section of the transistor. A common method to form a ballast resistor is to leave a gap between the gate edge and the drain silicide. FIG. 3 shows such ballast resistor gaps 44 in the drain regions of a waffle transistor 46. The reduced area of the drain silicide means that the drain rectangular area must be increased in order to provide the same current density through each drain as shown by the dashed rectangle 48 which corresponds to the perimeter of the one of the drains 26 shown in FIG. 1. As a result the size of each source also grows because the checkerboard grid pattern forces the drain and source squares to be the same size.

SUMMARY OF THE INVENTION

The invention comprises, in one form thereof, a MOSFET having a series of gates having a plurality of repeating vertical patterns, each pattern comprising first and second gates, each with alternating longer sections and a shorter sections which are offset from each or and connected by gate sections, and a third straight horizontal gate.

In still another form, the invention includes a method for forming a MOSFET. The method comprises the steps of forming a series of gates having a plurality of repeating patterns, each pattern comprising first and second gates, each with alternating longer sections and a shorter sections which are offset from each or and connected by gate sections, and a third straight horizontal gate, and forming a source region on one side and a drain region on an opposite side of each said first, second, and third gates.

BRIEF DESCRIPTION OF THE DRAWINGS

The features and advantages of this invention, and the manner of attaining them, will become apparent and be better understood by reference to the following description of the various embodiments of the invention in conjunction with the accompanying drawings, wherein:

FIGS. 11A-11E are top diagrammatical views of selected stages in the fabrication of the power transistor shown in FIG. 6;

FIGS. 12A-12D are top diagrammatical views of selected stages in the fabrication of the power transistor shown in FIG. 8A.

Figure 1:
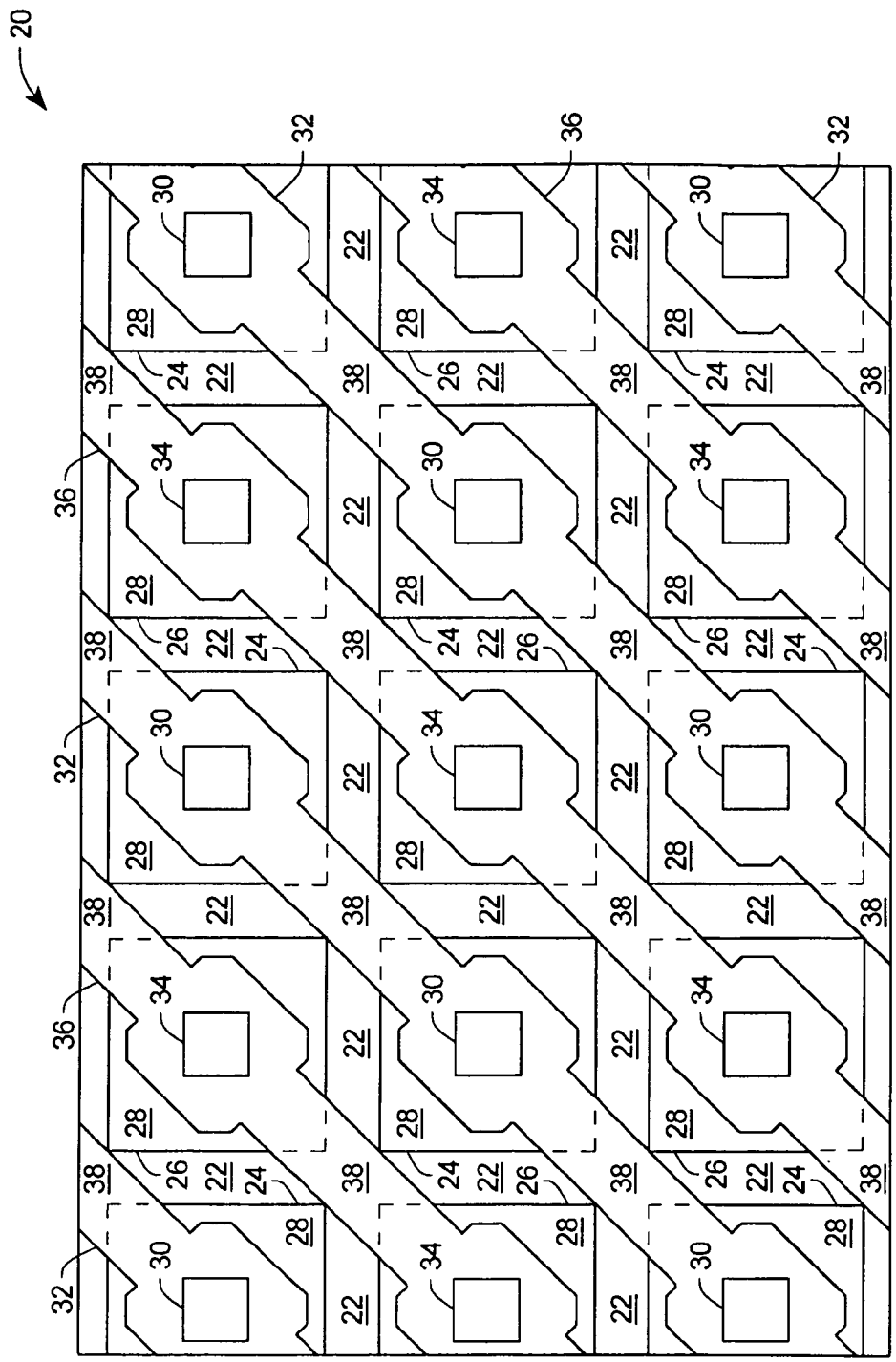
FIG. 1 is a top diagrammatic view of a prior art waffle transistor.
Figure 2:
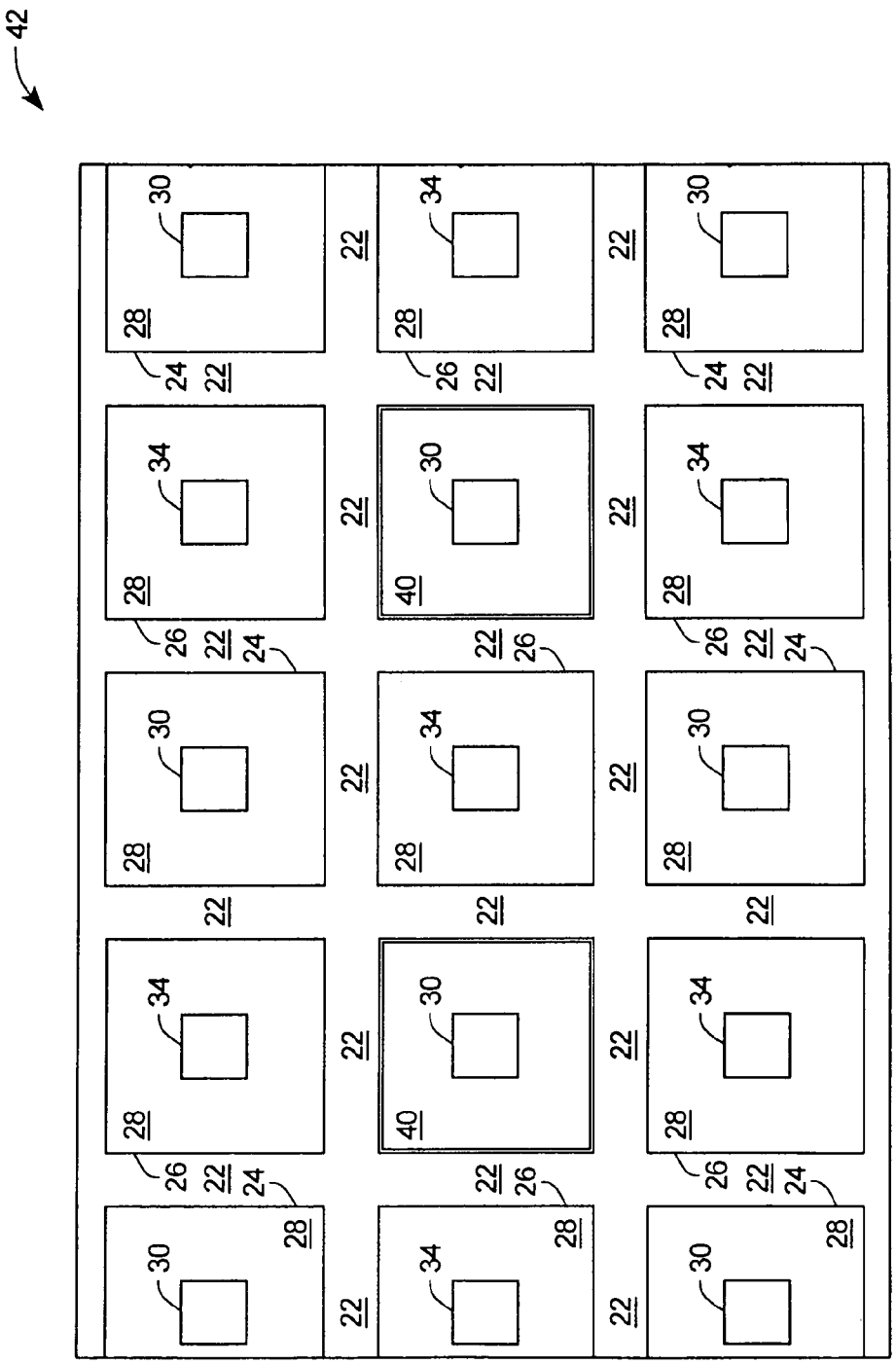
FIG. 2 is a top diagrammatic view of a modified version of the waffle transistor of FIG. 1.
Figure 3:
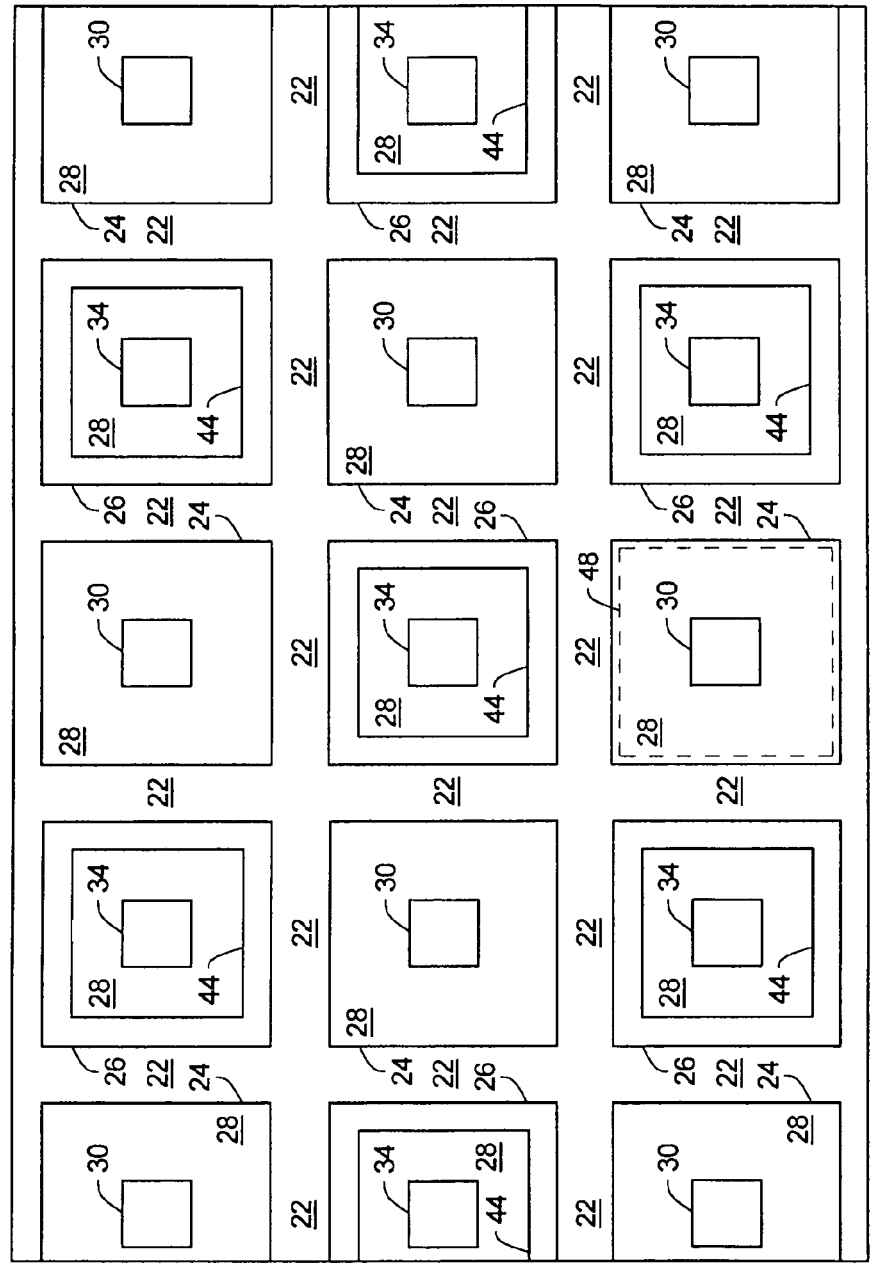
FIG. 3 is a top diagrammatic view of another modified version of the waffle transistor of FIG. 1.

It will be appreciated that for purposes of clarity, and where deemed appropriate, reference numerals have been repeated in the figures to indicate corresponding features. Also, the relative size of various objects in the drawings has in some cases been distorted to more clearly show the invention. The examples set out herein illustrate several embodiments of the invention but should not be construed as limiting the scope of the invention in any manner.

DETAILED DESCRIPTION

Figure 4:
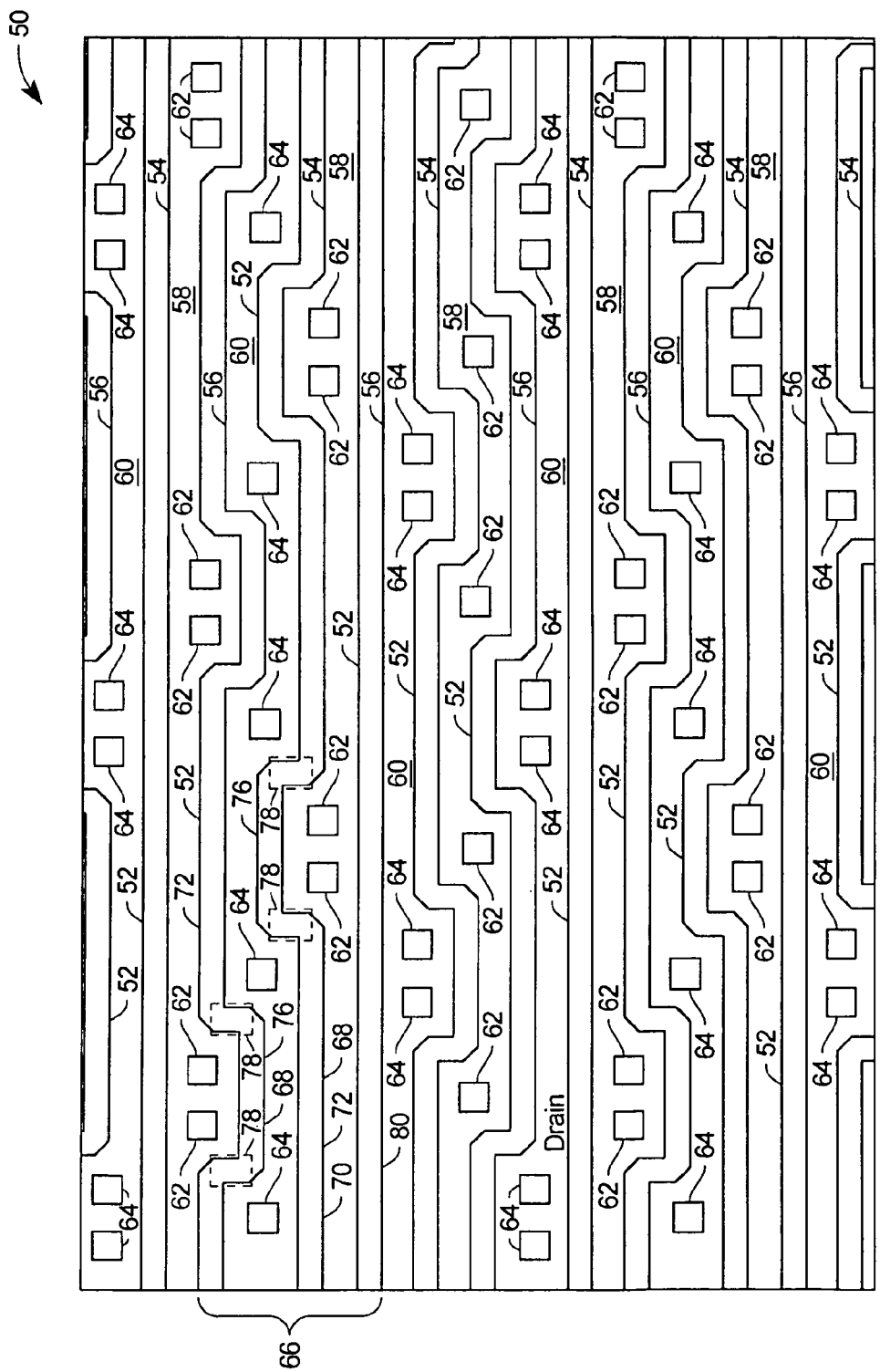
FIG. 4 is a top diagrammatic view of a power transistor according to an embodiment of the present invention.

FIG. 4 is a top diagrammatic view of a portion 50 of a power MOSFET having a plurality of gates 52 between source regions 54 and drain regions 56 according to one embodiment of the present invention. Overlaying the source regions 54 and the drain regions 56 are silicide layers 58 and 60, respectively. The source and drain regions 54, 56 have contacts 62 and 64, respectively, for connections to a metal 1 layer shown in some of the other figures. In the embodiment shown in the drawings, the contacts 62, 64 are square (in a top view), but the shape of the contacts 62, 64 may differ in other embodiments of the present invention. The gates 52 form a vertically repeating pattern 66 in FIG. 4, each vertical pattern having 3 different shaped gates, the first gate 68 and the second gate 70 of the vertical pattern have a horizontal "wave" pattern including a longer horizontal section 72 and a shorter horizontal section 76 connected by short vertical gate sections 78 which are arranged in a horizontal repeating pattern. The first gate 68 and the second gate 70 are offset mirror images of each other such that the shorter horizontal sections 76 are placed equidistance laterally between the two shorter horizontal sections 76 of the mirror image of the respective first and second gates 68,70. The third gate 80 of the vertical repeating 66 is a straight horizontal gate which is adjacent the longer sections 72 of two "wave" pattern gates on either side of the third gate 80.

The vertically repeating pattern 66 provides a greater useable gate width for a given chip area compared to the prior art layout shown in FIG. 1. The layout shown in FIG. 4 therefore provides a lower overall channel resistance per unit area than the layout shown in FIG. 1, which may be of importance in certain applications where the applied gate voltage is only slightly greater than the threshold voltage.

The chip area available for the gates in a multiple gate FET is usually dependent at least in part on the number and size of the contacts 62, 64. One design strategy, but not the only one, is to take advantage of the maximum current density characteristic of the contacts to determine the minimum number of contacts, and then to design the gate structure to provide the largest usable gate length. Another consideration is the distribution of the current density in the source and drain silicides around each of the contacts, and the effective width of the channel region under the gate that current flowing between the source and drain region must follow. Stated another way, in the embodiment shown in FIG. 4 the current from a drain contact will flow to several source contacts (for an N channel device), with varying amounts of current flowing to each of the source contacts from the single drain contact. A portion of this current will not flow through the shortest length of the gate channel, but will flow at an angle to the gate rather than perpendicular to the gate. Therefore, the placement of the contacts, which, in turn is determined by the shape of the gates, is another factor affecting the overall efficiency of the MOSFET. The position of the contacts 62, 64 in the structure shown in FIG. 4 is more efficient than the position of the contacts 30, 34 in the waffle structure shown in FIG. 1.

In FIG. 4 half of the contacts 62, 64 are placed laterally in the gaps between the alternating short horizontal sections 76 of the first and second gates 68, 70 of the vertically repeating pattern 66, and half of the contacts 62, 64 are placed partially in the alcove region formed by the offset of the short horizontal sections 76 from the long horizontal sections 78 of each of the gate segments 68, 70.

Although the number and size of the contacts 62, 64 may be one consideration in the amount of current that a power device can handle, another consideration may be the vias between the first and second metal layers. The current path through the metal layers is much longer than the current paths from the sources and drains to the first metal layer, and therefore the power lost in the metallization may be of major importance. While the prior art design shown in FIG. 1 uses two metal layers, one to connect the individual the sources and one to connect the drains, the use of multiple metal layers to reduce the combined metallization resistance is generally used. As a consequence the number and size of the vias between the two layers may be important.

Figure 5A:
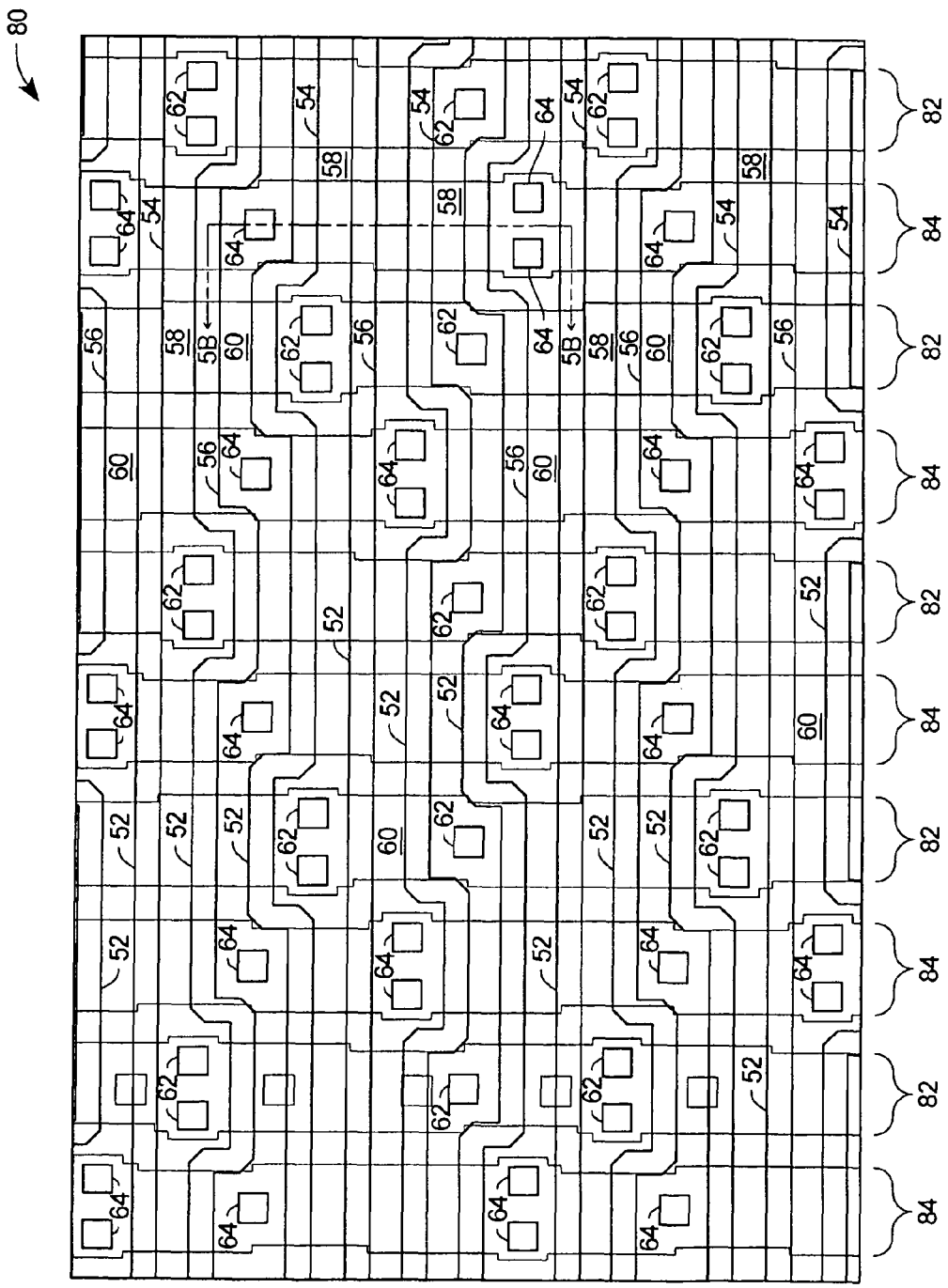
FIG. 5A is FIG. 4 with the addition of metal 1.
Figure 5B:
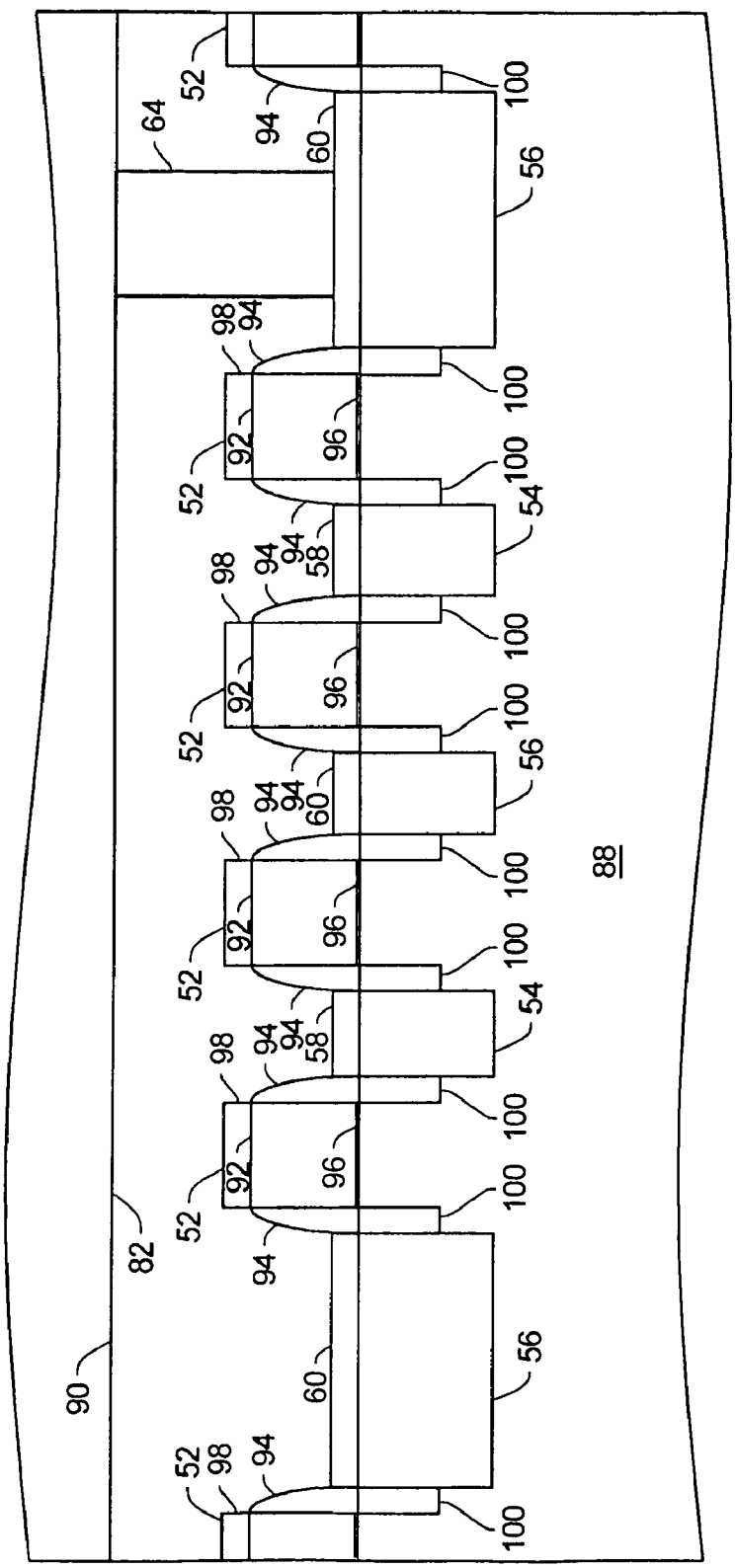
FIG. 5B is a side diagrammatic view taken along line 5B-5B in FIG. 5A.

FIG. 5A is a top diagrammatic view 80 of source metal 1 layers 82 and drain metal 1 layers 84 which are the metallization layers for the portion 50 of the power MOSFET shown in FIG. 4. FIG. 5B is a side diagrammatic view 86 taken along the line 5B-5B in FIG. 5A. Below the metal 1 layer 82 is an interlevel oxide layer 90 with the contacts 62, 64 shown in FIG. 4 (one of the contacts 64 is shown in FIG. 5B) extending through the second inter level oxide layer 90. Each of the gates 52 has a gate electrode 92, sidewall oxides 94, a gate oxide 96, and a silicide cap 98. Below each of the sidewall oxides is an LDD region 100. The semiconductor body 88 is of opposite conductivity type from the source and drain regions 54, 56 and the LDD regions 100. For example, if the device shown in FIG. 5B is an N channel MOSFET, the semiconductor body 88 would be P-type and the source, drain, and LDD regions 54, 56, 100 would be N-type. The semiconductor body 8 may be part of starting wafer, or it may be an epitaxial layer grown on the starting wafer, or it may be a well formed in such an epitaxial wafer.

Figure 5C:
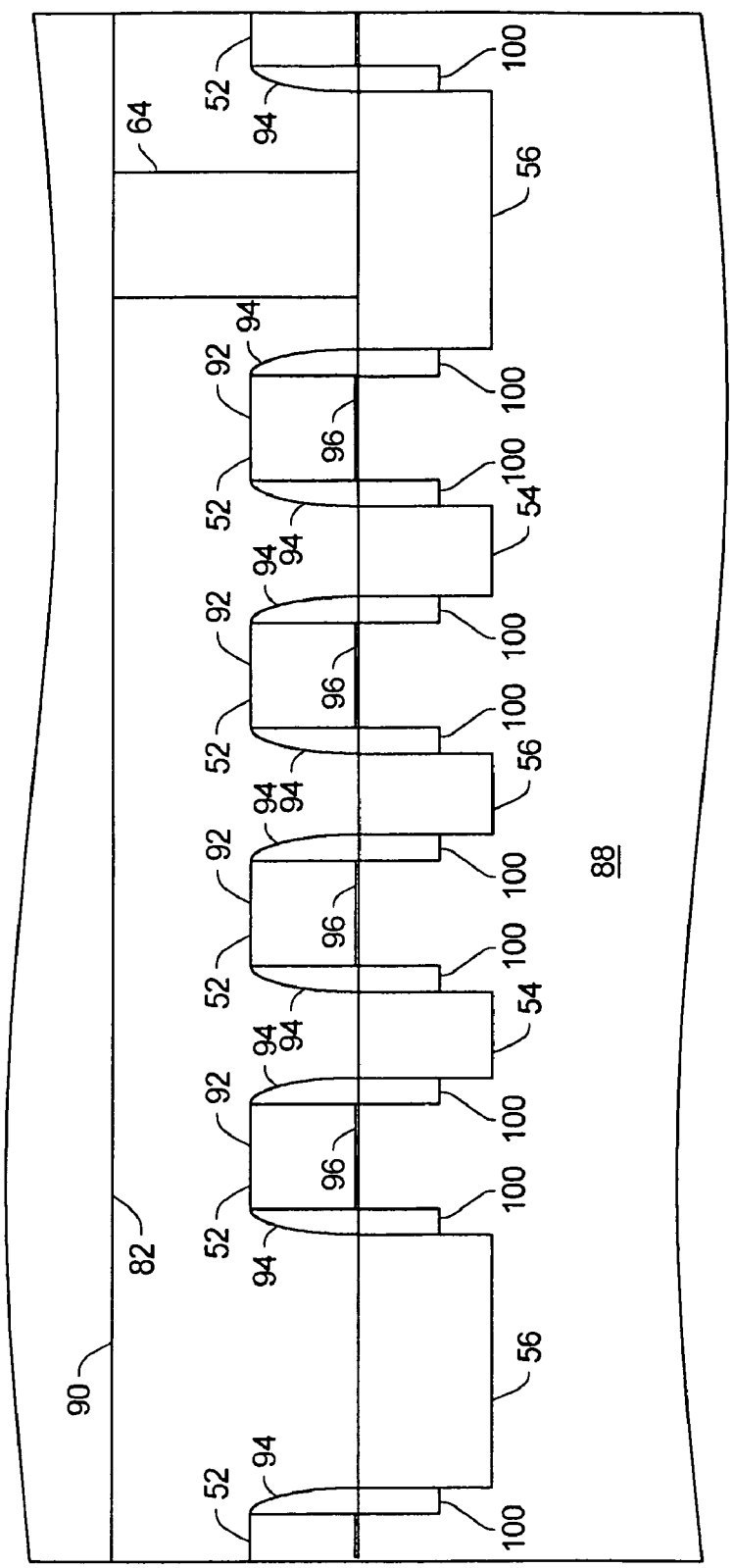
FIG. 5C is an variation of the embodiment shown in FIG. 5B.

FIG. 5C is a side diagrammatic view of a variation of the embodiment shown in FIG. 5B in that the silicide in FIGS. 4, 5A, and 5B is not present in the embodiment shown in FIG. 5C.

Figure 6:
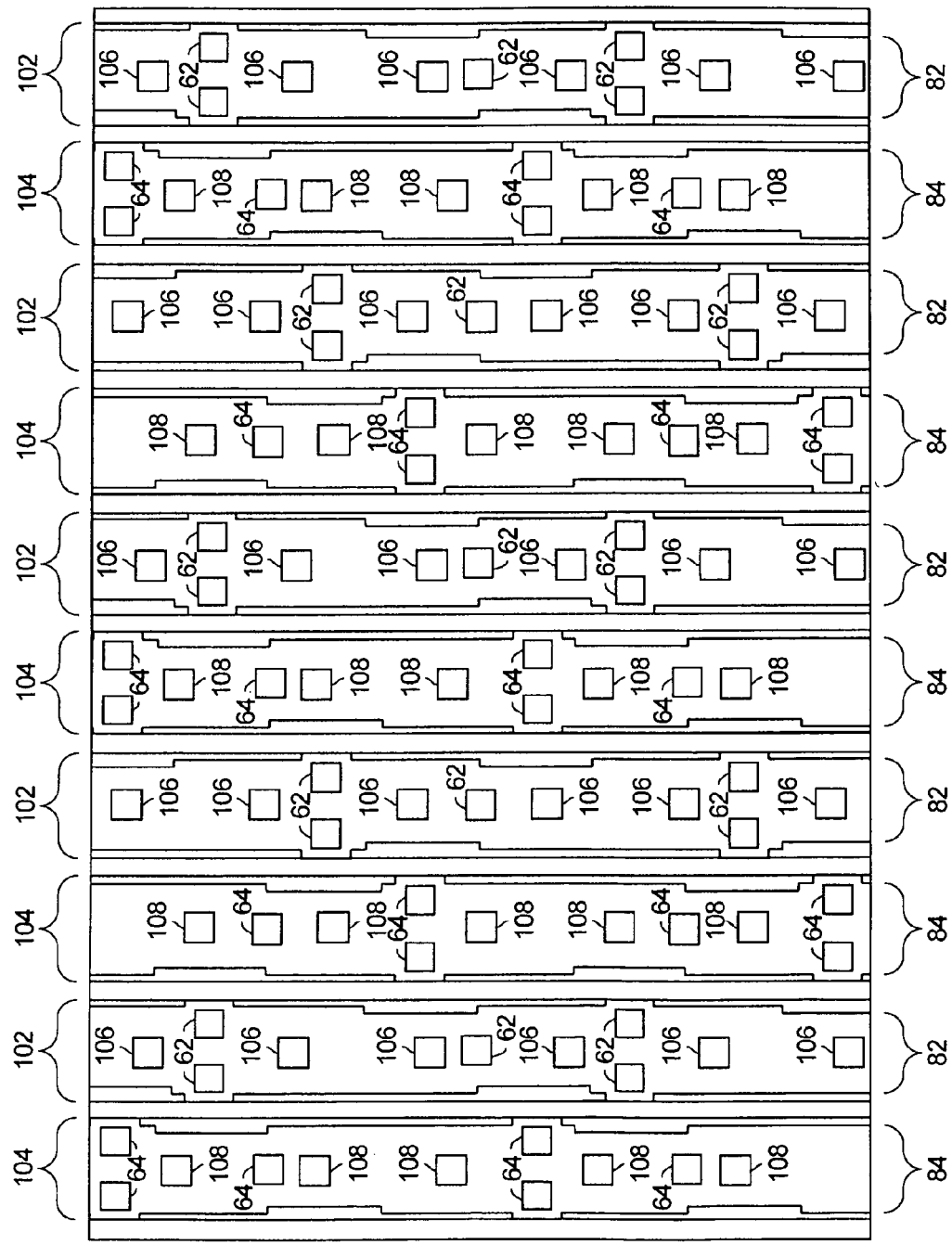
FIG. 6 is FIG. 5A with the addition of metal 2.

FIG. 6 is composite of the metal 1 layers 82, 84 of FIG. 5A and their respective metal 2 layers 102 and 104 along with the corresponding vias 106 and 108. The metal 2 layers 102, 104 are parallel strips which have a longitudinal axis parallel with the longitudinal axis of each of the metal 1 strips 82, 84. The vias 106, 108 are substantially equally spaced along each of the metal 2 strips 102, 104.

The large metallization areas shown in FIGS. 5A and 5B, as compared to the metallization of the waffle transistor shown in FIG. 1, are made possible by the source, drain, and gate layout shown in FIG. 4. The metallization shown in FIG. 6 allows a large part of the deposited metal to be retained during the metal etching process since the horizontal gap between the metal layers is limited by the minimum feature spacing of the manufacturing process, while the metal lines may be considerably larger than the minimum. In the contrasting case of the waffle transistor, both metal lines and spaces are of minimum or near minimum dimension, so effectively about 50% of the deposited metal is later removed by etching. Also, the current through both of the overlapping metal layers is flowing in the same direction effectively adding their thicknesses to reduce the total resistance and increase the allowable maximum current. Moreover, the effects of thickness variations in one metal layer can be mitigated by the other overlapping layer.

The number and size of the vias in one of the embodiments of the present invention are such that the two layers of metallization have approximately the same current density. Also, the quantity of vias used in a wave transistor greatly exceeds the number possible in a waffle transistor. Since the effects of the metallization may be one of the most important elements of the efficiency of the power device, being able to optimize the metallization, including the vias, is desirable.

Figure 7A:
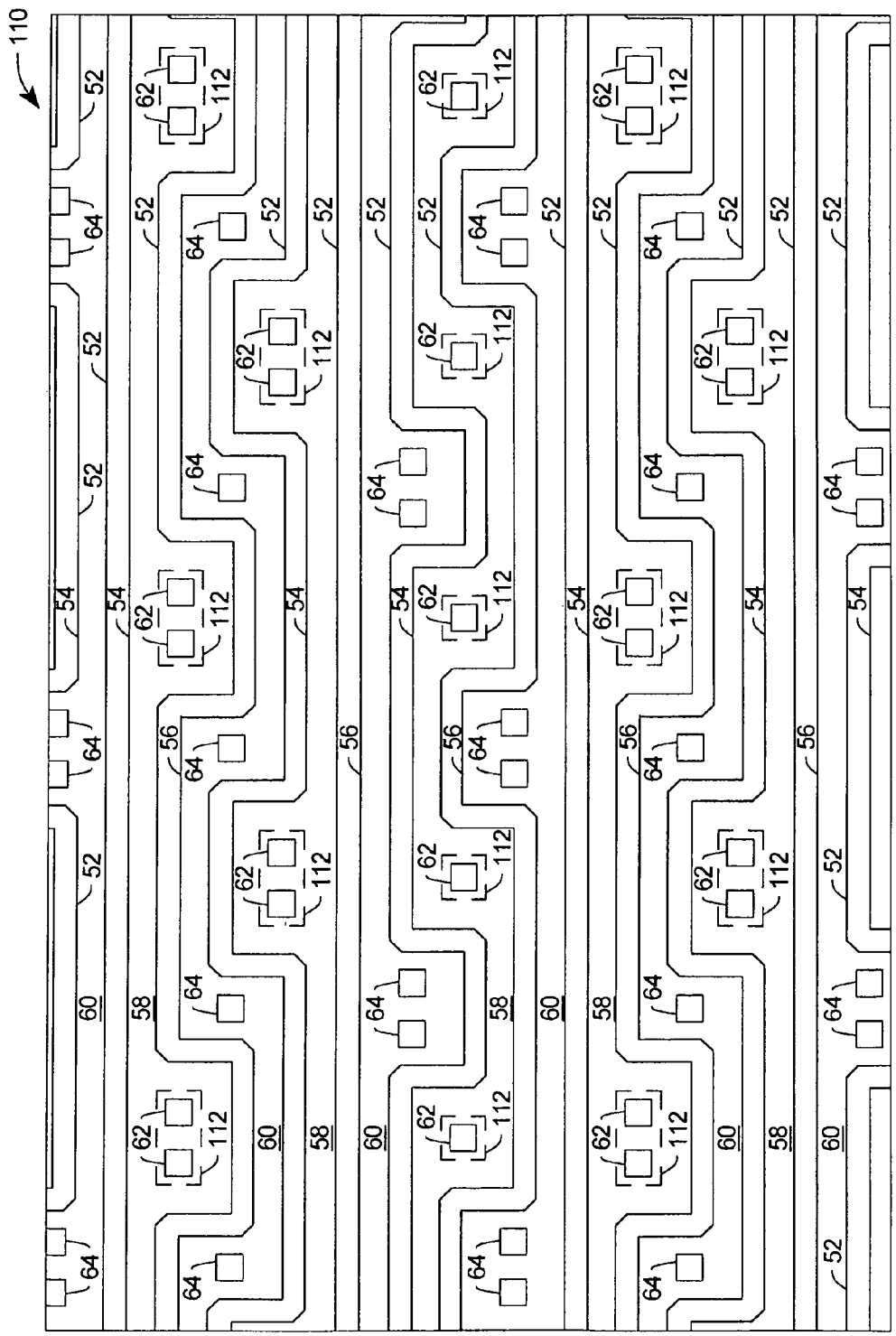
FIG. 7A is a top diagrammatic view of a power transistor according to another embodiment of the present invention.

FIG. 7A is a top diagrammatic top view 110 of the gates 52, sources 54, and drains 56 of FIG. 4 with the addition of source well ties 112. The source well ties 112 are heavily doped and of the same conductivity type as the semiconductor body 88. To accommodate the source well ties 112 the shorter horizontal sections 76 of FIG. 4 which have source contacts 62 have been lengthened, the gap between the short horizontal sections 76 which have source contacts has also been increased, and the vertical gate sections 78 of FIG. 4 have been lengthened.

Figure 7B:
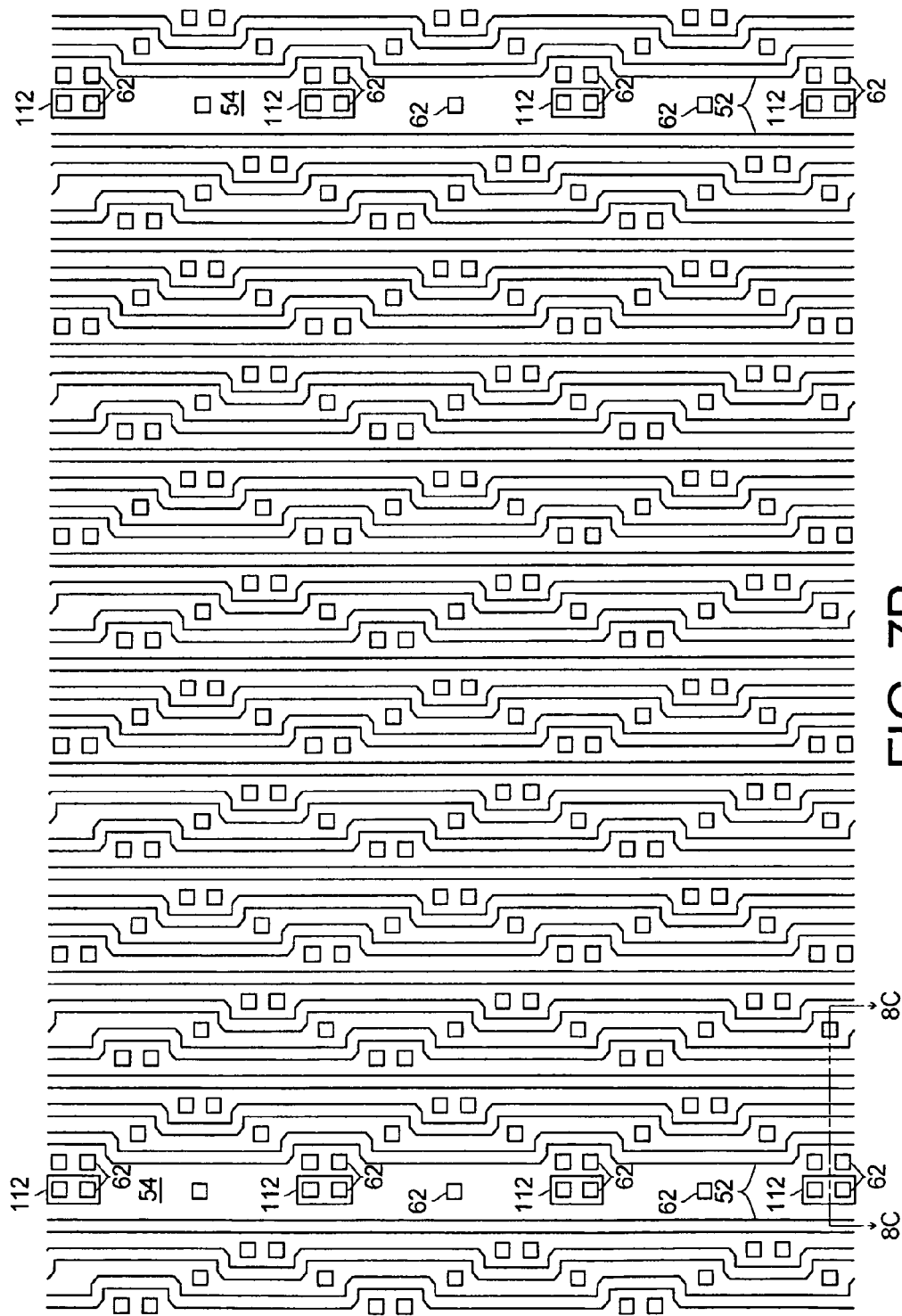
FIG. 7B is a variation of the embodiment shown in FIG. 7A.

FIG. 7B is a variation of the embodiment shown in FIG. 7A in that the silicide in FIG. 7A is not present in the embodiment shown in FIG. 7B. In the embodiment shown in FIG. 7B the sources with source well taps 112 are separated by 14 sources without well taps, but the number of sources between each of the sources with well taps can be greater or less than 14 as required to provide latchup suppression and good SOA.

Figure 8A:
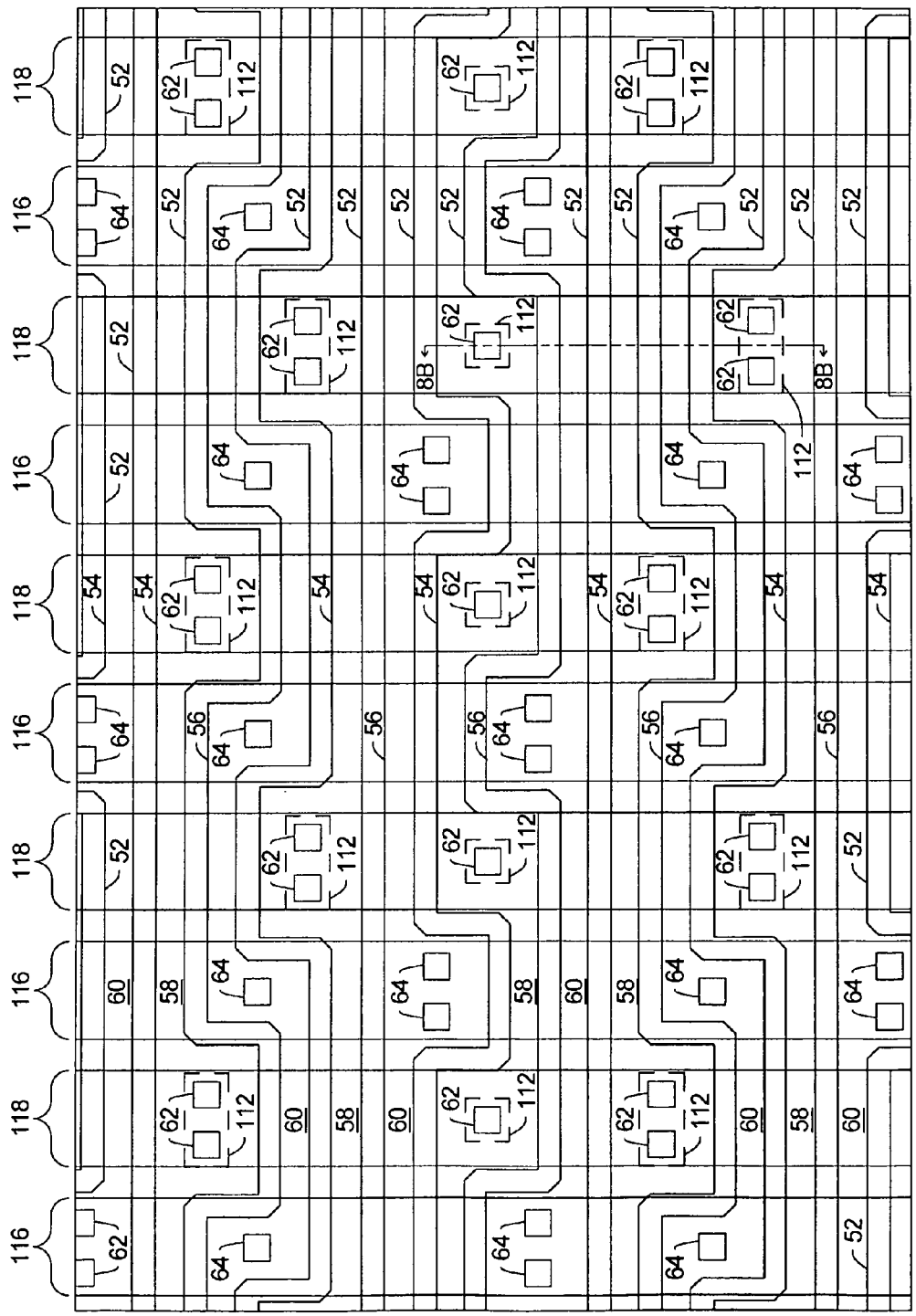
FIG. 8A is FIG. 7A with the addition of Metal 1.
Figure 8B:
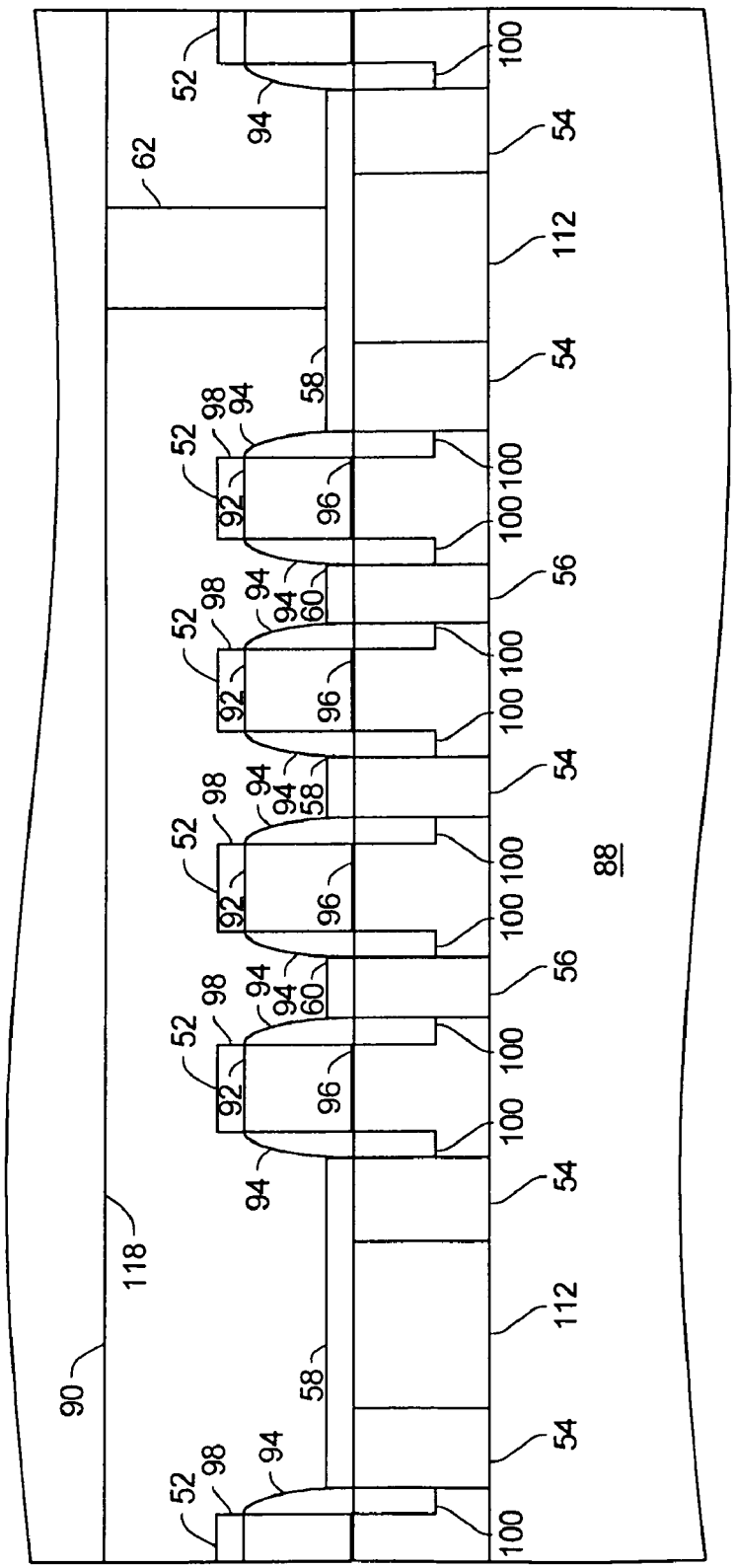
FIG. 8B is a side diagrammatic view taken along line 8A-8A in FIG. 7A.

FIG. 8A is FIG. 7A with the addition of the drain metal 1 strips 116 and the source metal 1 strips 118. FIG. 8B is a diagrammatic side view taken along line 8B-8B in FIG. 8A.

Figure 8C:
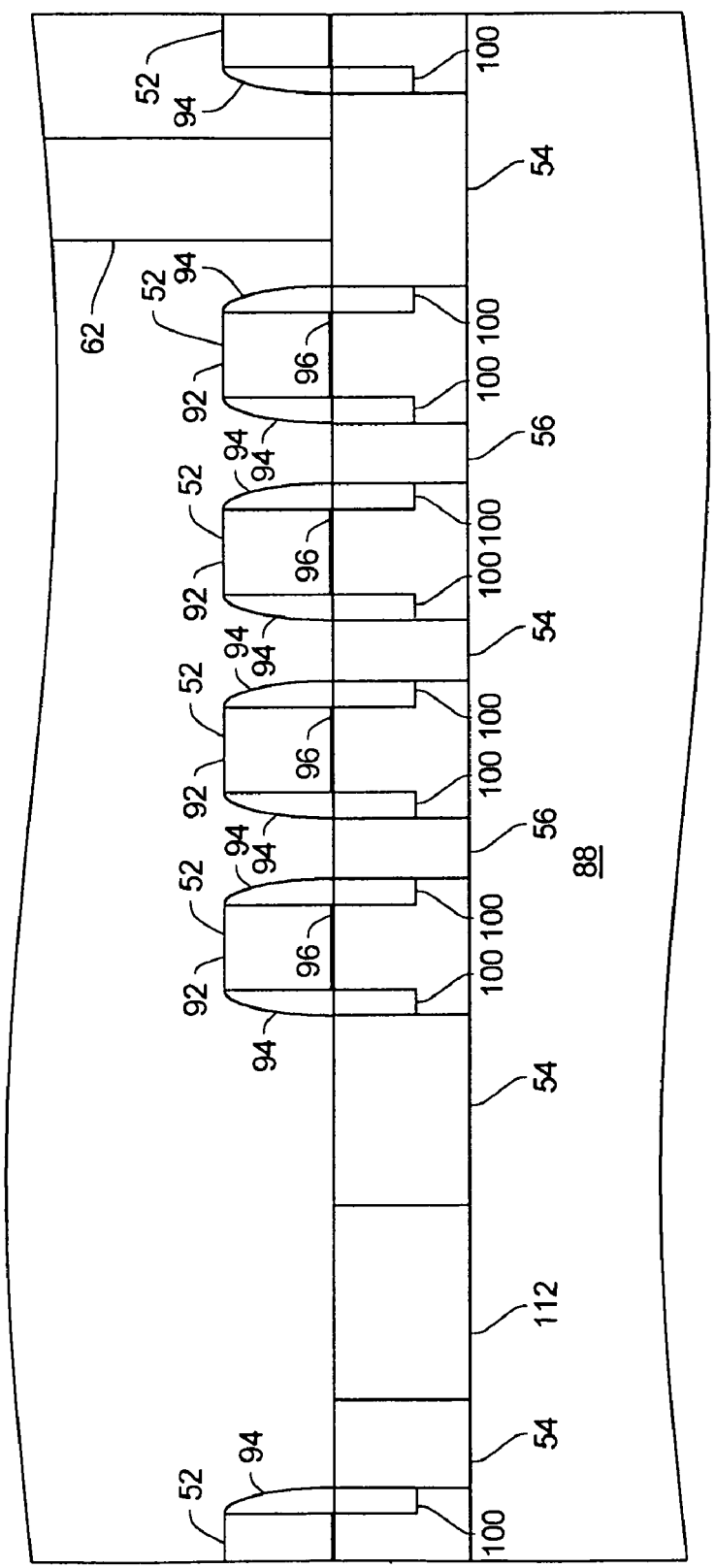
FIG. 8C is a side diagrammatic view taken along line 8C-8C in FIG. 7B.

FIG. 8C is a side diagrammatic view of a variation of the embodiment shown in FIG. 8B in that the silicide in FIGS. 7A, 8A, and 8B is not present in the embodiment shown in FIG. 5C.

Figure 9:
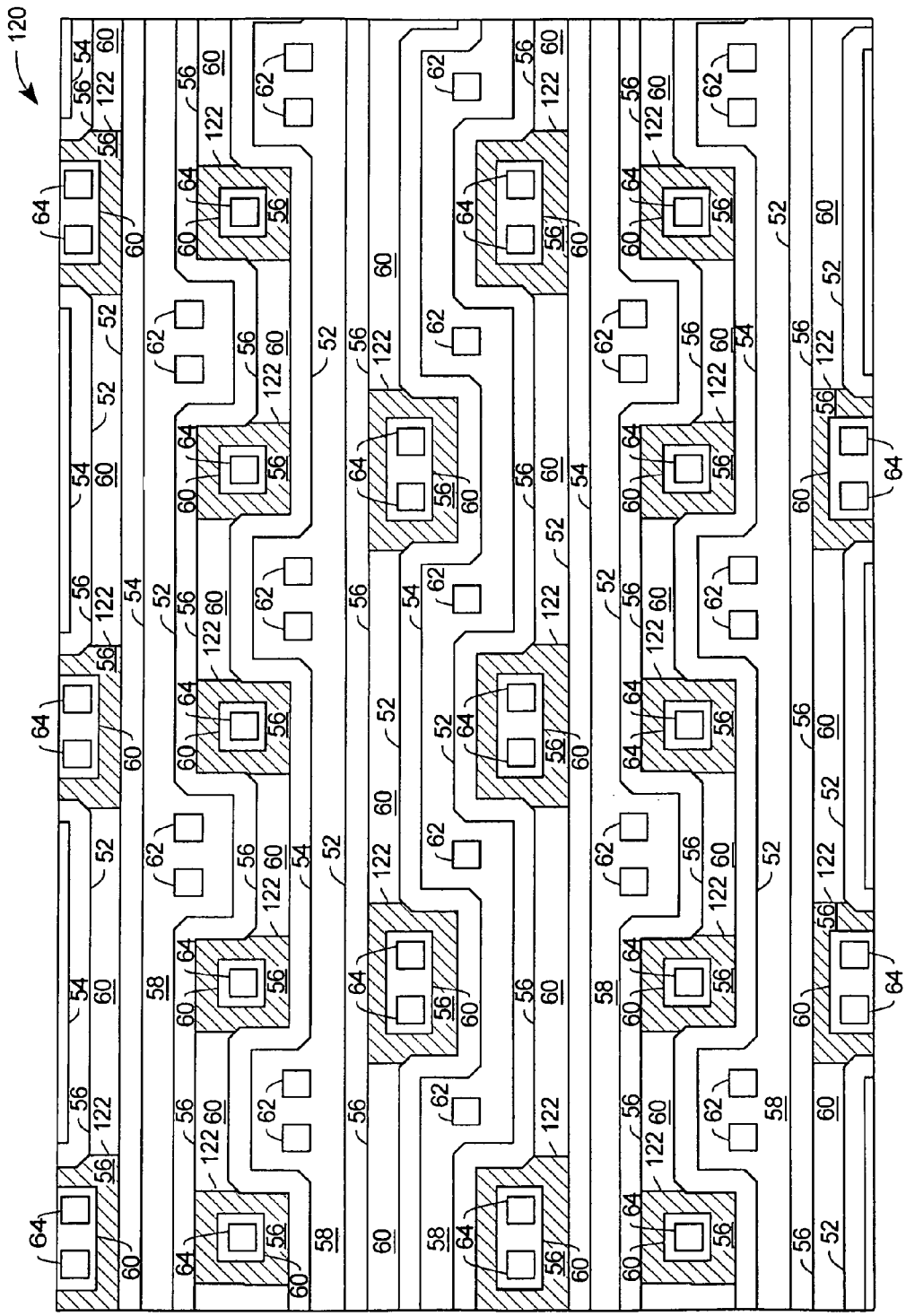
FIG. 9 is a top diagrammatic view of a power transistor according to yet another embodiment of the present invention.

FIG. 9 is a top diagrammatic top view 120 of the gates 52, sources 54, and drains 56 of FIG. 4 with the addition of drain ballasts 122. To accommodate the drain ballasts 122 the vertical gate sections 78 of FIG. 4 have been lengthened and the vertical distance between the gates 52 has been increased.

Figure 10A:
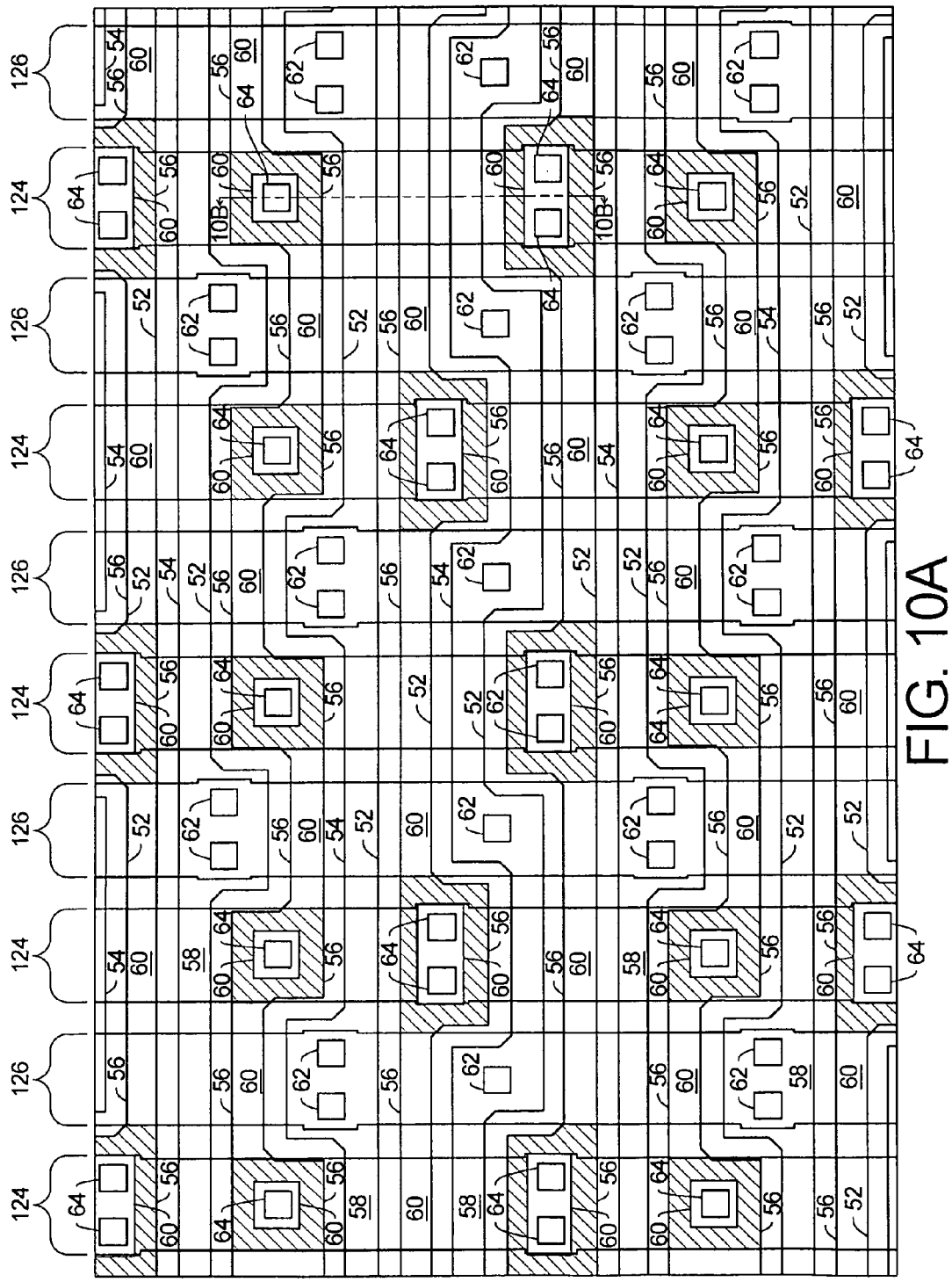
FIG. 10A is FIG. 9 with the addition of metal 1.
Figure 10B:
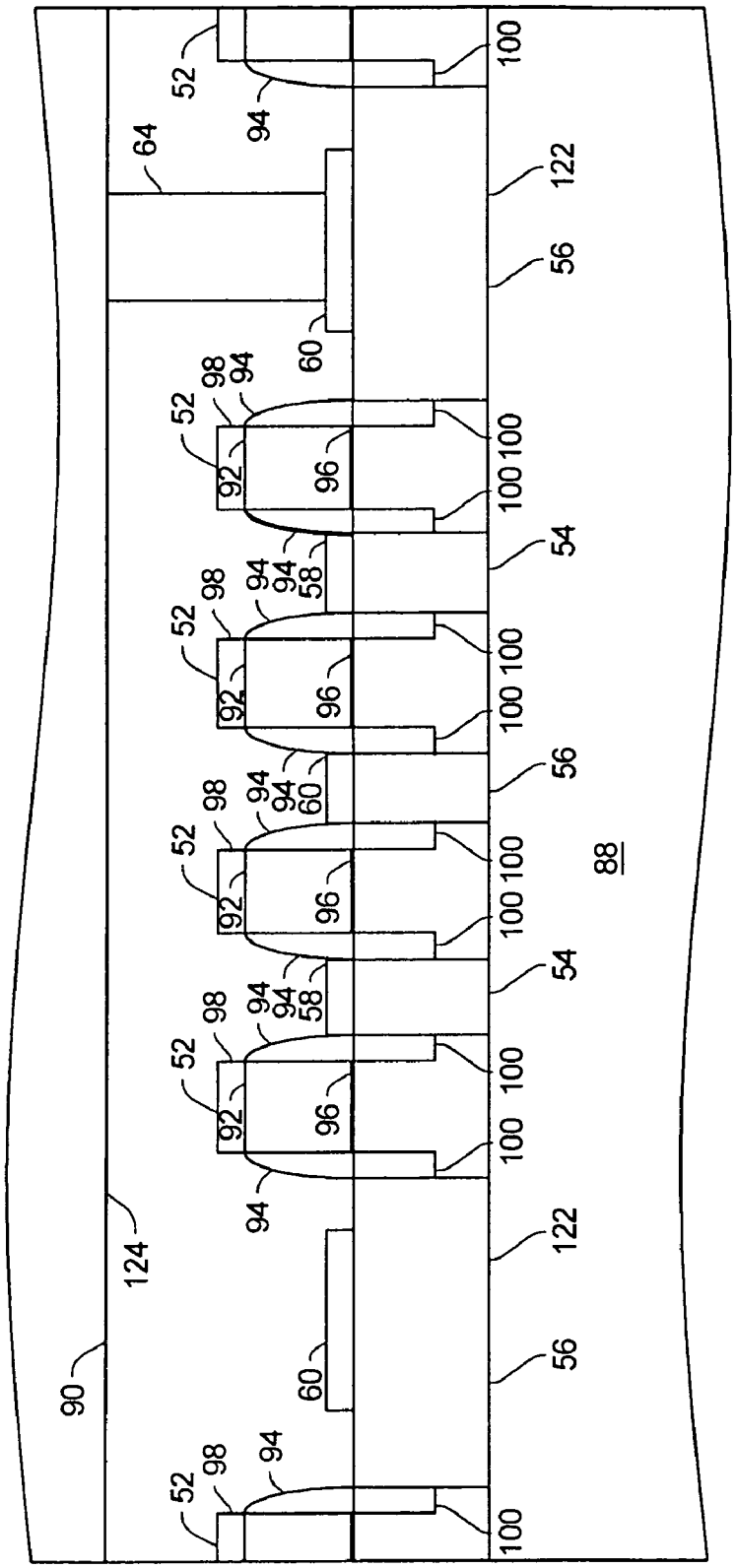
FIG. 10B is a side diagrammatic view taken along line 10B-10B in FIG. 10A.

FIG. 10A is FIG. 9 with the addition of the drain metal 1 strips 126 and the source metal 1 strips 128. FIG. 10B is a diagrammatic side view taken along line 10B-10B in FIG. 10A.

The power MOSFETs shown in FIGS. 4-8C can be both N channel and P channel MOSFETs, however the drain ballasts 122 shown in FIGS. 9, 10A, and 10B are not needed in P channel MOSFETs.

Figure 11A:
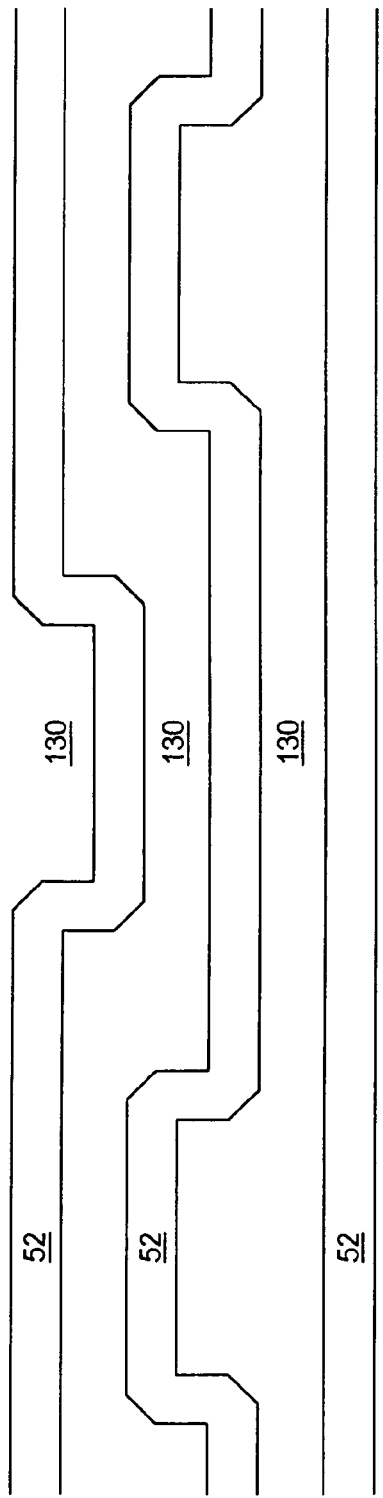
Figure 11B:
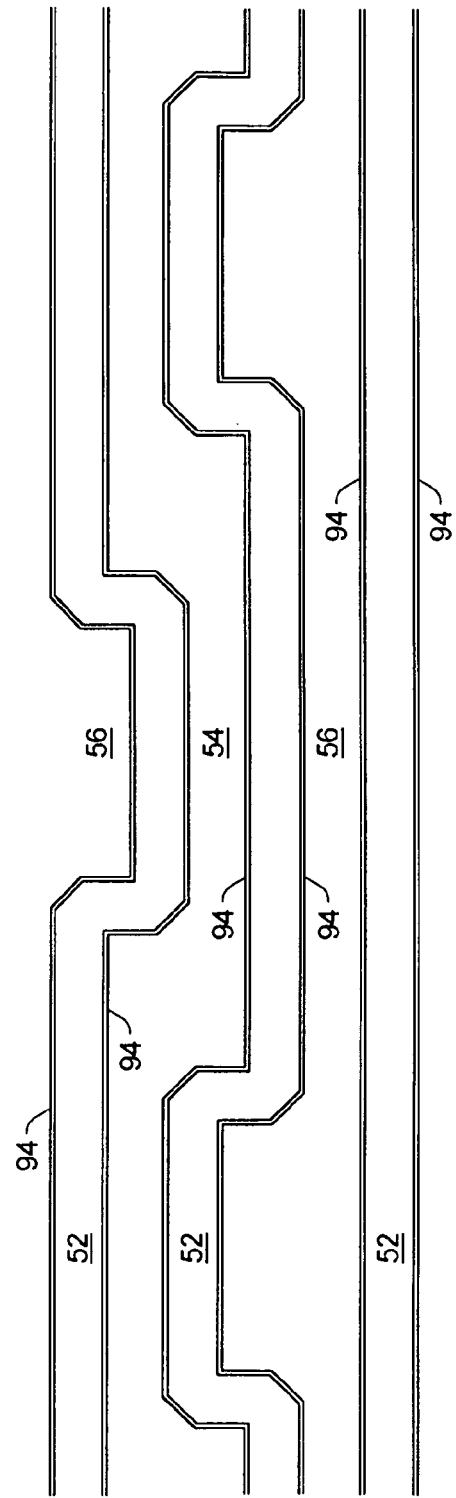
Figure 11E:
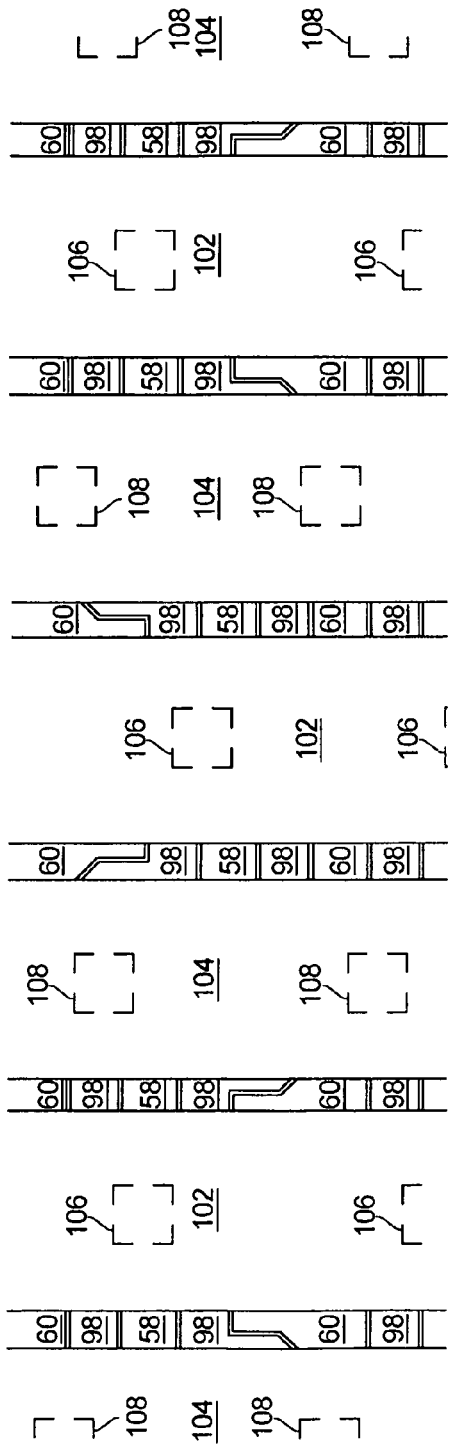

FIGS. 11A-11E are top diagrammatical views of selected stages in the fabrication of the power transistor shown in FIG. 6. In FIG. 11A the polysilicon gates 52 have been formed on the substrate or epitaxial layer 88 followed by a light implant to form regions 130 which will become the LDD regions 100. FIG. 11B is FIG. 11A after sidewall oxides 94 have been formed on the gates 52 followed by a blanket source and drain implant to form the source regions 54 and the drain regions 56. Silicide is formed on the polysilicon gates 52 and the source and drain regions 54, 56 to form the gate silicide 98, the source silicide 58 and the drain silicide 60 as shown in FIG. 11C. After contacts to the source and drain silicides 58, 60 are formed, a first layer of metal is deposited and etched to form the metal 1 layer consisting of source metal 1 strips 82 and drain metal 1 strips 84 as shown in FIG. 11D. The source 54 and drain 56 vias 106 and 108, respectively, are formed is in an interlevel dielectric layer, and the second metal is deposited and etched to form the metal 2 layer consisting of source metal 2 strips 106 and drain metal 2 strips 108 as shown in FIG. 11E.

Figure 12A:
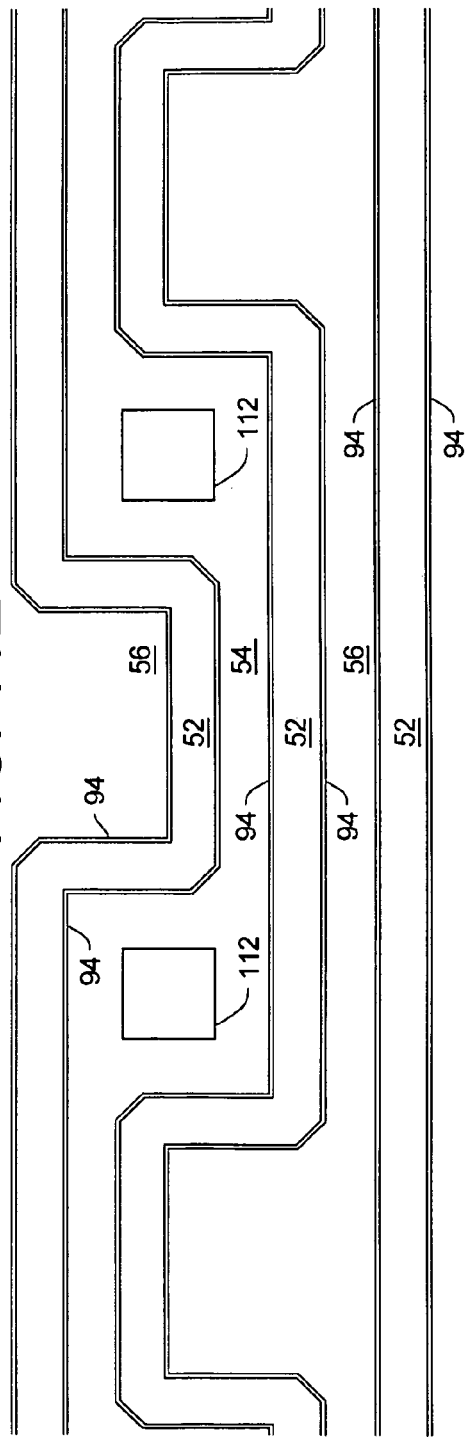
Figure 12D:
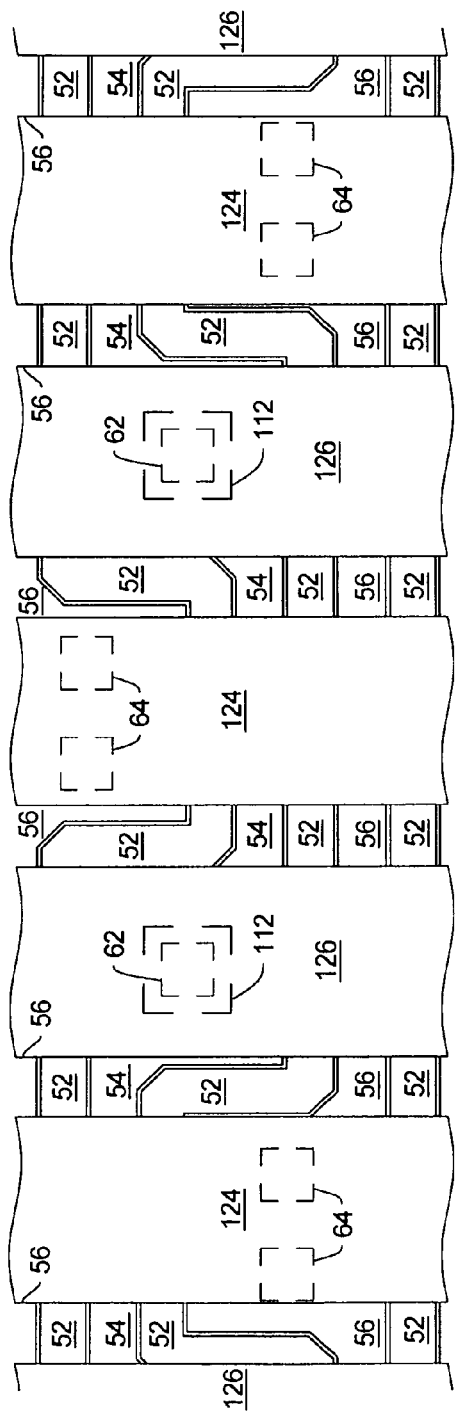

FIGS. 12A-12D are top diagrammatical views of selected stages in the fabrication of the power transistor shown in FIG. 8A. FIG. 12A is the same processing stage as shown in FIG. 11B. In FIG. 12A source well ties 112 have been formed in the source regions 54 by ion implanting regions 112 with high concentration dopants of the same conductivity type as the substrate after the source regions 54 have been formed. A self-aligned silicide process is performed to form the device shown in FIG. 12B, and contacts 62, 64 to the source and drain regions 54, 56, respectively are formed as shown in FIG. 12C. The first level metallization is formed in FIG. 12D. The second level metallization is the same as shown in FIG. 11E.

Figure 13A:
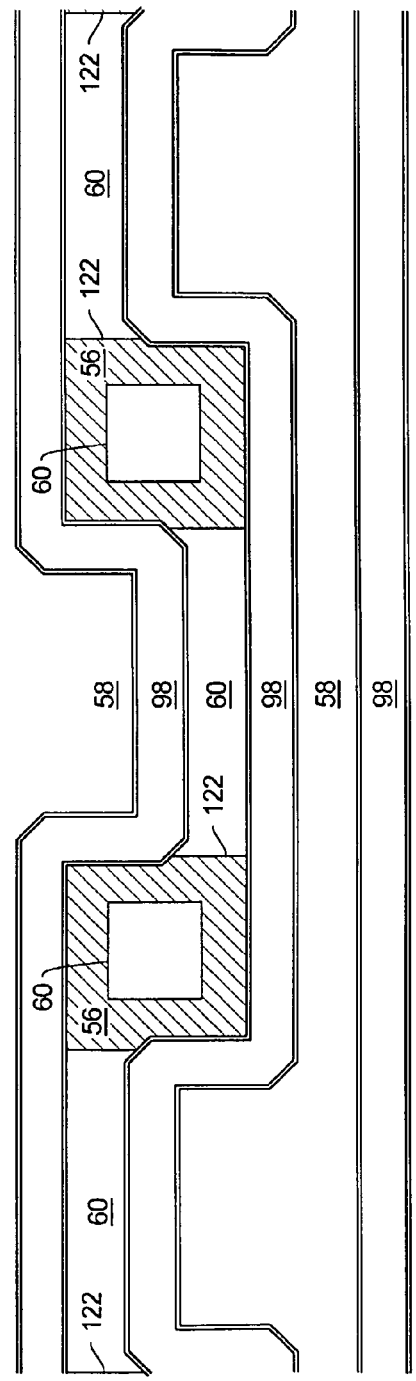
FIGS. 13A-13C are top diagrammatical views of selected stages in the fabrication of the power transistor shown in FIG. 10A.
Figure 13B:
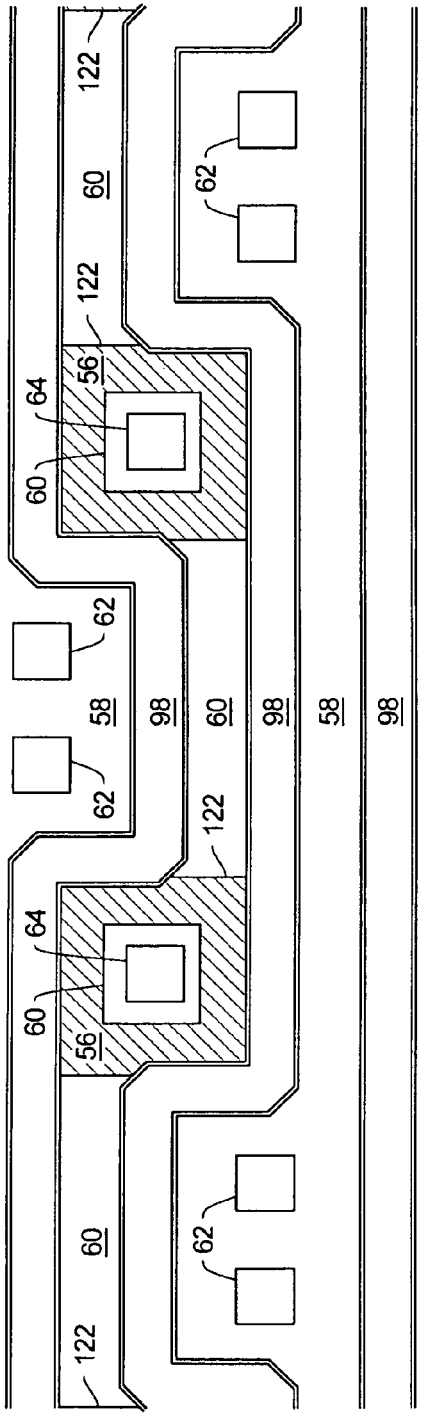
Figure 13C:
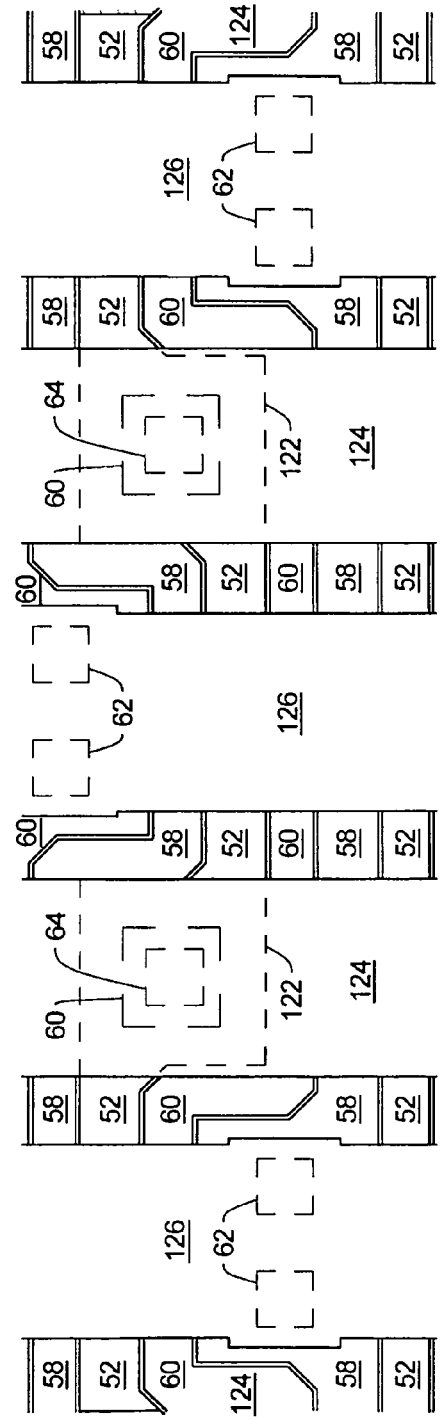

FIGS. 13A-13C are top diagrammatical views of selected stages in the fabrication of the power transistor shown in FIG. 10A. FIG. 13A is the same processing stage as shown in FIG. 11C. In FIG. 13A, however, unsilicided islands 122 are present in the drain silicides 60 to form drain ballasts. Inside each of the islands 122 is a silicided region 60 which form bases for the drain contacts 64. Both the drain contacts 64 and the source contacts 62 are shown in FIG. 13B, and the first level metallization is shown in FIG. 13C.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A MOSFET comprising
a series of patterned gates,
each gate extending horizontally across a surface of the MOSFET,
said series of patterned gates repeating down a surface of the MOSFET in a direction transverse to the length of the gates,
said patterned gates comprising first second and third gates,
each of said first and second gates with a pattern of alternating longer sections and shorter sections
said longer and shorter sections of each of the first and second gates are offset from each other and said longer and shorter sections of each gate are connected by transverse gate sections, and
a third straight horizontal gate.

2. The MOSFET set forth in claim 1 wherein said first and second gates are offset mirror images of each other.

3. The MOSFET set forth in claim 1 further including contacts adjacent each of said gate sections.

4. The MOSFET set forth in claim 1 further including a source and a drain on opposite sides of each of said first, second, and third gates, said source and said drain each having a contact to a metallization layer.

5. The MOSFET set forth in claim 4 wherein said source is silicided with said contact connected directly to said silicide.

6. The MOSFET set forth in claim 5 wherein a well tie extends from said source silicide to below said source and drain in said MOSFET.

7. The MOSFET set forth in claim 6 wherein said contact is positioned directly above said well tie.

8. The MOSFET set forth in claim 4 wherein said drain is silicided with said contact connected directly to said silicide.

9. The MOSFET set forth in claim 4 wherein said drain has said contact connected to a silicided region of said drain, said silicided region being isolated from other silicided regions of said drain.

10. The MOSFET set forth is claim 4 wherein said repeating pattern is periodically separated by a gap which includes source well ties, each of said source well ties having a well tie contact connected directly to said well tie, and extending from said well tie contact to a region below said source and drain in said MOSFET.

11. The MOSFET set forth in claim 1 wherein each of said first, second, and third gates have silicide contacts.

12. The MOSFET of claim 1 wherein the three gates extend along separate paths which are alongside each other.

13. The MOSFET of claim 1 wherein no one gate intersects another gate.

14. A MOSFET having a rectangular surface and comprising:
 a repeated series of three gates, said gates extending horizontally along separate paths that transit the rectangular surface, said paths each spaced from each other along their respective transits of the rectangular surface;
 a first of said three gates having alternate long and short sections disposed along its length;
 a second of said three gates spaced from the first gate having alternate long and short sections disposed along the length of the second gate wherein long sections of the second gate are opposite short sections of the first gate and short sections of the second gate are opposite long sections of the first gate; and
 a third of said three gates spaced from the second gate and extending horizontally in a substantially straight line across the rectangular surface.

15. The device of claim 14 wherein the short sections of the first gate project away from the third gate and toward the second gate.

16. The device of claim 14 wherein the short sections of the second gate project toward the third gate and toward the first gate.

17. The MOSFET set forth in claim 14 further including a source and a drain on opposite sides of each of said first, second, and third gates, said source and said drain each having a contact to a metallization layer.

18. The MOSFET set forth in claim 17 wherein each of said first, second, and third gates have silicide contacts.

19. The MOSFET set forth in claim 17 wherein said source is silicided with said contact connected directly to said silicide.

20. The MOSFET set forth in claim 19 wherein a well tie extends from said source silicide to below said source and drain in said MOSFET.

21. The MOSFET set forth in claim 20 wherein said contact is positioned directly above said well tie.

22. The MOSFET set forth in claim 17 wherein said drain is silicided with said contact connected directly to said silicide.

23. The MOSFET set forth in claim 17 wherein said drain has said contact connected to a silicided region of said drain, said silicided region being isolated from other silicided regions of said drain.

24. The MOSFET set forth is claim 17 wherein said repeating pattern is periodically separated by a gap which includes source well ties, each of said source well ties having a well tie contact connected directly to said well tie, and extending from said well tie contact to a region below said source and drain in said MOSFET.

* * * * *